United States Patent [19]

Kleinböhl

[11] 4,403,818
[45] Sep. 13, 1983

[54] INSTRUMENT PANEL FOR VEHICLES

[75] Inventor: Helmut Kleinböhl, Riedstadt, Fed. Rep. of Germany

[73] Assignee: General Motors Corporation, Detroit, Mich.

[21] Appl. No.: 269,879

[22] Filed: Jun. 3, 1981

[30] Foreign Application Priority Data

Jun. 26, 1980 [DE] Fed. Rep. of Germany ....... 3023905

[51] Int. Cl.³ ...................... B60K 37/00; H01R 33/00
[52] U.S. Cl. ...................................... 339/10; 180/90; 296/70
[58] Field of Search ............... 339/17 R, 17 C, 17 D, 339/10; 174/68.5; 296/70; 361/346, 401; 180/90

[56] References Cited

U.S. PATENT DOCUMENTS 3,015,718  1/1962  Petri .................................. 240/8.16

FOREIGN PATENT DOCUMENTS 687765  6/1964  Canada .................................. 180/90
859047  1/1961  United Kingdom ............... 174/68.5
1240789  7/1971  United Kingdom ............... 174/68.5

OTHER PUBLICATIONS

"New Advances in Printed Circuits," Misc. Pub. 192, Nat'l Bureau of Stds, Nov. 1948, pp. 42–44.

Primary Examiner—Eugene F. Desmond
Attorney, Agent, or Firm—Warren D. Hill

[57] ABSTRACT

An instrument panel for automotive vehicles is molded of an insulating plastics material and carries electrical conductors on the rear surface leading to indicating and control instruments on the front. Several grooves on the rear surface, one for each conductor, are coated along their flanks with a conductive material such as a conductive paint to form the conductors. Cavities extending through the panel allow contact springs to connect the conductors on the rear to the instruments on the front.

2 Claims, 4 Drawing Figures

INSTRUMENT PANEL FOR VEHICLES

The invention relates to an electrically nonconductive instrument panel for motor vehicles and more particularly to such a panel including electrical current conductors located in grooves on the back of the panel and extending to the various indicating and control instruments.

In accordance with current practice, accessories such as switches, instruments, indicators, electric lighting and control devices, radios, clocks, cigar lighters etc. are typically mounted for electrical contact onto the instrument panel of a vehicle, especially a motor vehicle, by means of individual electrical conductors and plugs. As a result, in todays cars there are some 50 to 90 wire leads that must be connected for electrical contact in back of the instrument panel, making manufacturing procedures inefficient in terms of cost and labor. The installation of the numerous electric wires is difficult. Oftentimes, the mechanic has to work while lying on his back and skilled workmen are required for the installation. A portion of the wiring is often accomplished by printed circuit conductors.

It is the object of the instant invention to provide means which facilitate and simplify the electrical connection of the instruments and other accessories mounted on the instrument board and at the same time eliminate possible sources of failures.

In an effort to resolve these problems, it is proposed that in an instrument board of the type described above conductor tracks made of electrically conductive material are applied to the structurally fashioned rear side of the instrument panel to serve as current conductors. Preferably, these conductor tracks are comprised of an electrically conductive paint and are applied to the back of the instrument panel by spraying or immersion enamelling or lacquering. Cathodic sputtering is another possible method.

As a result of eliminating individual wires, the instrument panel has increased operational reliability and is easier to service. The electrical accessories carried on the instrument panel can be easily installed and removed by any unskilled person. Other advantages achieved by the instant invention are compactness and clearness in arrangement as well as savings in material and weight. Potential sources of failures are reduced to a minimum, and electrical current losses caused by resistances in electrical conductors are also reduced.

In the preferred embodiment of the invention it is proposed that the back of the instrument panel be of a fluted or grooved cross section, i.e. of a corrugated or, preferably, a toothed configuration, and that the conductor tracks be disposed at the flanks of the corrugations or teeth. The crests of the corrugations or, as the case may be, the apexes of the teeth at the rear of the instrument panel are to have extremely low surface roughness to the effect that the electrically conductive material that is being applied adheres only to the flanks of the corrugations or the teeth which have a relatively large surface roughness.

This allows that a great number of electrical conductor tracks may be disposed within a relatively small surface area. Also, the conductor tracks are protected against damage, and by virtue of its corrugated shape, the instrument panel will be of relatively low weight and yet of a highly stable structure, similar to that of corrugated sheet metal or profiled sheets of plastics material. An additional advantage to be gained is the savings in material.

In a further preferred embodiment of the invention the instrument panel, including its corrugated back side structure and the compartments for the indicating and/or the control instruments at the front side, is in the form of an injection-molded plastic panel, and the instrument panel, including all structural details and compartments, can thus be manufactured in one single operation and in a simple and economical fashion.

In accordance with a further significant advantage of the invention, an instrument panel of this type may be manufactured in a most advantageous fashion in that it employs a metal injection mold having grooves that have been machined into said mold, and said grooves having an extremely fine-pored surface characteristic, preferably of the lapped and polished type, only at their respective lowermost points. Thus, the desired extremely low surface roughness at the crests of the corrugations in the instrument panel is achieved without additional machining. Obviously, the workman may use his own discretion to briefly abrade the grooved back side of the instrument panel (using, for instance, sandpaper) after the painting operation to ensure that each of the crests is free of paint and thus is electrically nonconductive.

The above and other advantages will be made more apparent from the following specification taken in conjunction with the accompanying drawings wherein like reference numerals refer to like parts and wherein.

Figure 1:
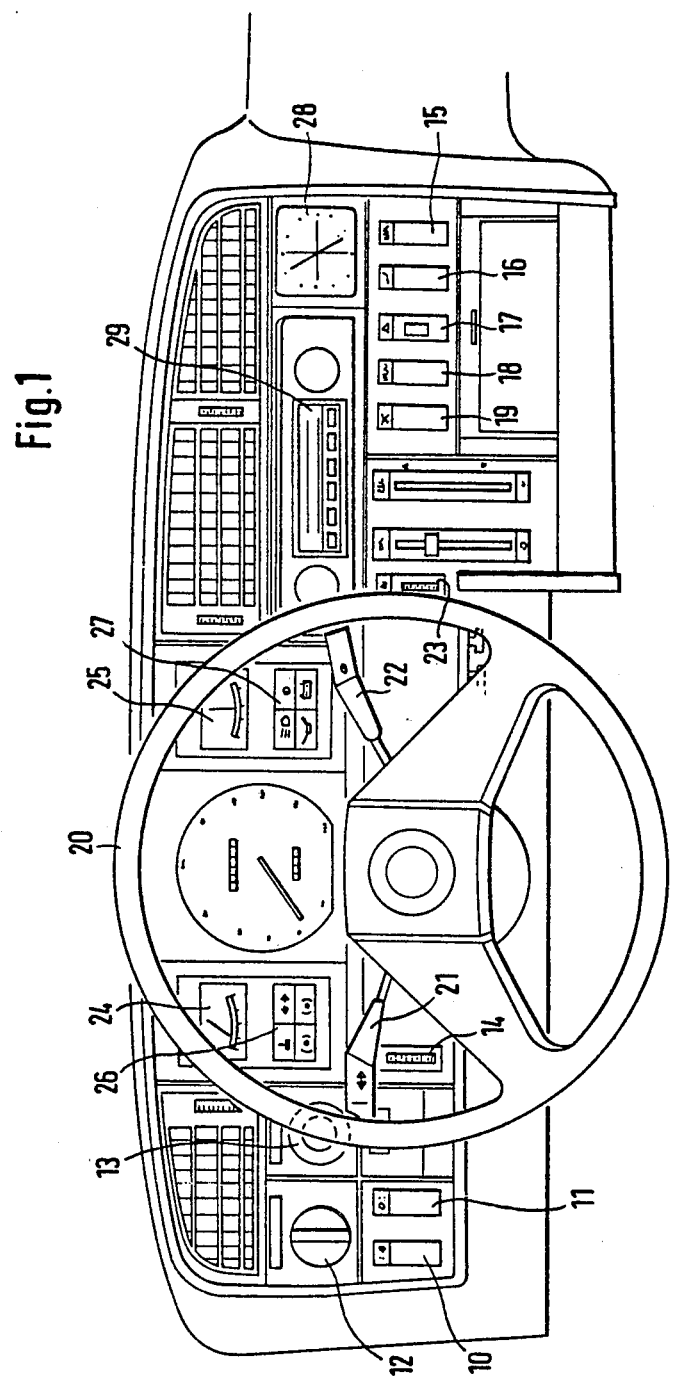
FIG. 1 is a front view of one embodiment of an automotive type instrument panel according to the invention.

In FIG. 1 some of the more common electrically operated indicating and control instruments mounted in automotive instrument panels are recognizable. Numeral 10 designates a switch for actuating the front-mounted fog lights, numeral 11 the switch for the rear-mounted fog lights, numeral 12 is a headlight switch, numeral 13 a light beam regulator, numeral 14 a switch for the instrument panel lighting, numeral 15 the rear window washer switch, numeral 16 a switch for operating the seat cushion heater, numeral 17 a switch for the warning lights, numeral 18 a switch for the rear window heater and numeral 19 a switch for the blower. In the area of the steering wheel there is a direction indicator switch 21 and a windshield washer switch 22. Other electrically actuated indicating instruments (such as coolant temperature gauge, oil pressure and temperature gauge, fuel level gauge etc.) are identified by numerals 24 to 27. Additional electrically operated accessories mounted in the instrument panel are a clock 28 and a radio receiver 29. It should be noted that the instruments, switches and accessories mentioned above are not an exhaustive enumeration of electrically operated, components used in automotive instrument panels but are merely representative examples.

Figure 2:
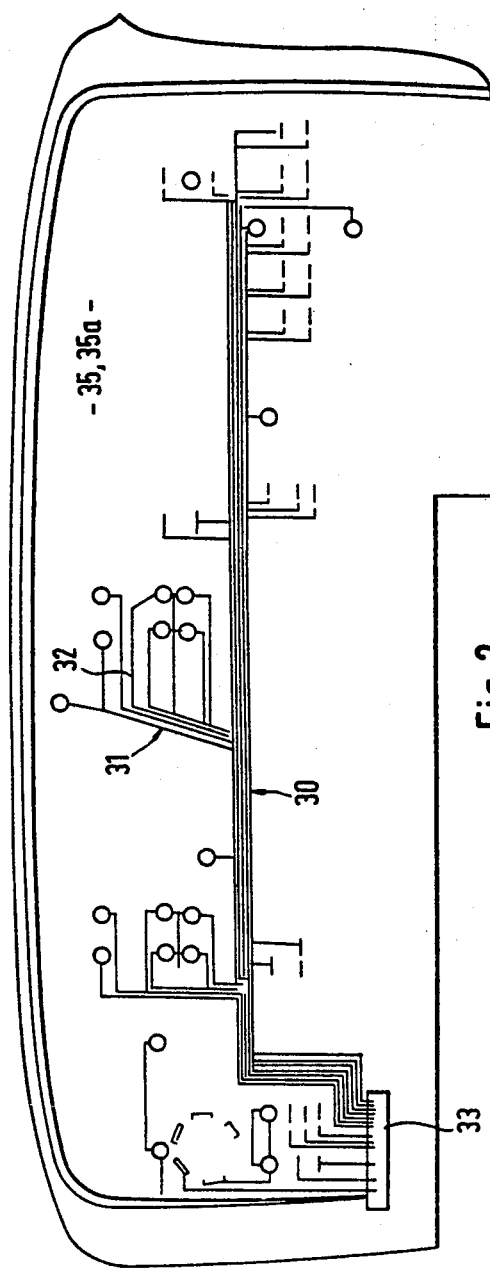
FIG. 2 is a rear view of the panel of FIG. 1.

FIG. 2 illustrates the back side of the instrument panel shown in front view in FIG. 1. On the back side are located the individual conductor tracks or paths which serve for transporting the electrical energy to the indicating and control devices shown in FIG. 1 and enumerated in the foregoing text. Numeral 30 designates a substantially rectilinearly extending track comprising a plurality of conductor paths disposed parallel to one another, of which individual conductor paths, also in parallel, branch off in a transverse direction as shown at 31. From it, a number of individual conductor paths, for instance those identified by the numeral 32, again branch off and connect to the various instruments and control devices. At the ends of the conductor tracks, shown at the left of FIG. 2, there is disposed a schematically illustrated plug-board 33 which serves as a contact terminal for the individual conductor paths.

Figure 3:
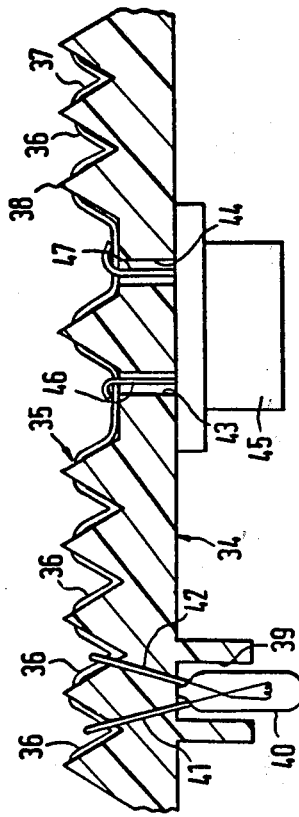
FIG. 3 is a partial cross-sectional view of the instrument panel of FIGS. 1 and 2.

FIG. 3 is an enlarged cross-section of that area of the instrument panel in which the conductor paths are located. The front of the instrument panel is designated by the numeral 34, and the rear by the numeral 35. FIG. 3 illustrates that the back 35 in the area of the individual conductor paths 36 is of a tooth-shaped structure. The conductor paths 36, which are preferably made of electrically conductive paint, extend along the flanks of the teeth, whereas the areas along the crests 38 of the toothed structure are not covered by a layer of electrically conducting paint. The objective to keep the crest areas free from the electrically conductive paint is achieved by the technique of imparting to that particular area a relatively low surface roughness.

Figure 4:
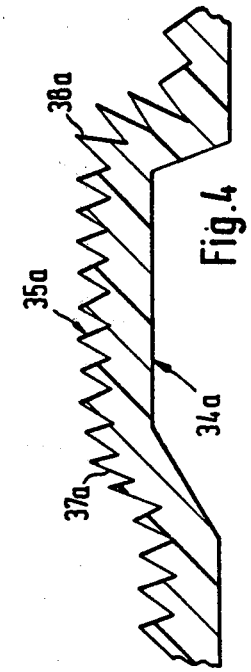
FIG. 4 is a cross-sectional view of another embodiment of an instrument panel according to the invention.

The compartments for the instruments and controls are formed in the front side 34 of the instrument panel. One such compartment 39 serves for the mounting of an indicator lamp 40. The electrical connection of indicator lamp 40 to the respective conductor paths 36 is established by way of contact springs 41, 42 which are disposed throughout the instrument panel in suitable recesses 43, 44. In addition to the indicator lamp 40, there is also illustrated on the front side 34 of the instrument panel another instrument 45, which may be an indicating instrument or a control element. Here, too, the electrical connection to the conductor tracks is by way of contact springs 46, 47. In the embodiment according to FIG. 4, the instrument panel is not flat over its entire area, as in FIG. 3, but is bent or curved. Here, the front side is designated by the numeral 34a, and the rear side by 35a. The illustration in FIG. 4 is to demonstrate that the structure of the back of the instrument panel 35a, i.e. the type of grooving and inclination of the flanks 37a, must be adapted to the over-all cross-sectional structure of the instrument panel such that on each of the flanks 37a the run-off of the applied paint from the crests and apexes 38a is ensured in order to bring about a separation of the individual conductor tracks 36 (see FIG. 3).

At the end of the groove-shaped structure of the instrument panel and on the back side thereof, contact tongues may be provided to which the previously mentioned plug board 33 may be attached for establishing contact with the individual conductor paths. However, one may also make use of plug boards 33 provided with plug-in pins in the form of the triangular cross-section of the grooves in the back 35, 35a of the instrument panel for establishing a direct connection with the conductor paths.

The embodiments of the invention in which an exclusive property or privilege is claimed are defined as follows:

1. A vehicle instrument panel comprised of an insulating plastics material supporting individual indicating and control elements on the front side thereof and electric current paths on the rear side leading to the said elements, the rear side of the panel being corrugated or toothed to define a plurality of triangular cross-section grooves running in the direction of the desired paths, the grooves having apexes and flanks, and electrically conductive material coating the flanks of the grooves to form the current paths.

2. A vehicle instrument panel comprised of an insulating plastics material supporting individual indicating and control elements on the front side thereof and electric current paths on the rear side leading to the said elements, the rear side of the panel being corrugated or toothed to define a plurality of triangular cross-section grooves, having apexes and flanks, and electrically conductive material coating the flanks of the grooves to form the current paths, the apexes of the grooves having an extremely low surface roughness and the flanks forming the lower parts of the grooves having a higher surface roughness so that the conductive material adheres only at the flanks having higher surface roughness.

* * * * *